United States Patent
Chang (10) Patent No.: US 9,467,160 B2
(45) Date of Patent: Oct. 11, 2016

(54) FLASH ADC WITH INTERPOLATORS

(71) Applicant: MediaTek Inc., Hsin-Chu (TW)

(72) Inventor: Wen-Hua Chang, Tainan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/538,013

(22) Filed: Nov. 11, 2014

(65) Prior Publication Data

US 2016/0134298 A1 May 12, 2016

(51) Int. Cl.
*H03M 1/12* (2006.01)
*H03M 1/20* (2006.01)
*H03M 1/36* (2006.01)

(52) U.S. Cl.
CPC ............. *H03M 1/205* (2013.01); *H03M 1/206* (2013.01); *H03M 1/361* (2013.01); *H03M 1/365* (2013.01)

(58) Field of Classification Search
CPC .............................. H03M 1/205; H03M 1/361
USPC .................................. 341/155, 122, 160, 143
See application file for complete search history.

(56) References Cited

U.S. PATENT DOCUMENTS

| | | | | |
|---|---|---|---|---|
| 6,707,413 B2 * | 3/2004 | Sushihara | ............. | H03M 1/204 341/159 |
| 6,775,338 B1 * | 8/2004 | Sutardja | .................. | G11B 20/14 375/345 |
| 7,884,748 B2 * | 2/2011 | Delagnes | ............. | G04F 10/005 341/156 |
| 8,130,131 B2 * | 3/2012 | Nakajima | ............. | H03M 1/002 341/155 |
| 8,183,903 B2 * | 5/2012 | Glass | .................... | H03M 1/204 327/231 |
| 8,514,121 B1 | 8/2013 | Shu | | |
| 2007/0109167 A1 * | 5/2007 | Morisson | ............ | H03M 1/0682 341/155 |
| 2010/0085232 A1 * | 4/2010 | Nicolas | ................. | H03M 1/362 341/159 |

FOREIGN PATENT DOCUMENTS

WO 2009074971 A1 6/2009

OTHER PUBLICATIONS

Lee, et al.: "A 5-b 10-GSample/s A/D Converter for 10-Gb/s Optical Receivers"; IEEE Journal of Solid-State Circuits, vol. 39, No. 10, Oct. 2004; pp. 1671-1679.
Colleran, et al: "A 10-b, 75-MHz Two-Stage Pipelined Bipolar A/D Converter"; 8107 IEEE Journal of Solid-State circuits Dec. 28, 1993, No. 12, New York, US; pp. 1187-1199.
Chen, et al.: "A 12-Bit 3 GS/s Pipeline ADC With 0.4 mm2 and 500 mW in 40 nm Digital CMOS"; IEEE Journal of Solid-State Circuits, vol. 47, No. 4, Apr. 2012; pp. 1013-1021.
Uyttenhove, et al.: "Design Techniques and Implementation of an 8-bit 200-MS/s Interpolating/Averaging CMOS A/D Converter"; IEEE Journal of Solid-State Circuits, vol. 38, No. 3, Mar. 2003; pp. 483-494.

* cited by examiner

*Primary Examiner* — Peguy Jean Pierre
(74) *Attorney, Agent, or Firm* — McClure, Qualey & Rodack, LLP (57) ABSTRACT

An ADC is provided. The ADC includes a plurality of pre-amplifiers, dynamic comparators coupled to the pre-amplifiers, interpolators and an encoder. Each pre-amplifier provides a pair of differential outputs according to a pair of differential analog signals and a first reference voltage and a second reference voltage different from the first reference voltage. Each dynamic comparator provides a first comparing signal and a second comparing signal according to the pair of differential outputs of the corresponding pre-amplifier. Each interpolator provides an interpolating signal according to the first and second comparing signals of two of the dynamic comparators. The encoder provides a digital output according to the interpolating signals. The first and second comparing signals are the same in a reset phase, and the first and second comparing signals are complementary according to the pair of differential outputs of the corresponding pre-amplifier in an evaluation phase.

21 Claims, 11 Drawing Sheets

FLASH ADC WITH INTERPOLATORS

BACKGROUND OF THE INVENTION

1. Field of the Invention

The invention relates to flash analog-to-digital converters (ADCs), and more particularly to a flash ADC with a plurality of interpolators.

2. Description of the Related Art

Currently, analog-to-digital converters (ADCs) are widely used in a variety of applications, such as medical systems, audio systems, test and measurement equipment, communication systems, and image and video systems, etc. The most common ADC construction comprises flash ADCs, pipeline ADCs and successive approximation register (SAR) ADCs, wherein the flash ADC and the pipeline ADC are faster than the SAR ADC.

High-speed and low-resolution flash ADCs are widely used in current circuit systems, such as disk drive read channel, DVD playback, and communication receiver systems. In general, the number of comparators required to construct conventional flash ADCs is exponentially related to the number of bits of the conventional flash ADCs. For example, the conventional flash ADC with N-bits of resolution requires $2^N-1$ comparators. Thus, an N-bit flash ADC has $2^N-1$ comparators, arranged in cardinal order to compare the same input signal against a respective cardinal order of $2^N-1$ equally spaced reference voltages. However, each comparator will occupy a larger chip area Therefore, a flash ADC with a plurality of interpolators is desired to decrease the number of comparators required.

BRIEF SUMMARY OF THE INVENTION

ADCs with a plurality of interpolators are provided. An embodiment of an ADC is provided. The ADC comprises a plurality of pre-amplifiers, a plurality of dynamic comparators coupled to the pre-amplifiers, a plurality of interpolators and an encoder. Each pre-amplifier provides a pair of differential outputs according to a pair of differential analog signals and a first reference voltage and a second reference voltage, wherein the first reference voltage corresponding to one of the differential analog signals is different from the second reference voltage corresponding to another of the differential analog signals. Each dynamic comparator provides a first comparing signal and a second comparing signal according to the pair of differential outputs of the corresponding pre-amplifier. Each interpolator provides an interpolating signal according to the first and second comparing signals of two of the dynamic comparators. The encoder provides a digital output according to the interpolating signals. The first and second comparing signals are the same in a reset phase, and the first and second comparing signals are complementary according to the pair of differential outputs of the corresponding pre-amplifier in an evaluation phase.

Furthermore, another embodiment of an ADC is provided. The ADC comprises a plurality of pre-amplifiers, a plurality of dynamic comparators coupled to the pre-amplifiers, a plurality of interpolators and an encoder. Each pre-amplifier provides a pair of differential outputs according to a pair of differential analog signals and a first reference voltage and a second reference voltage, wherein the first reference voltage corresponding to one of the differential analog signals is different from the second reference voltage corresponding to another of the differential analog signals. Each dynamic comparator provides a first comparing signal and a second comparing signal according to the pair of differential outputs of the corresponding pre-amplifier. Each interpolator provides an interpolating signal according to the first and second comparing signals of two of the dynamic comparators. The encoder provides a digital output according to the interpolating signals. When one of the differential analog signals is between the first reference voltages corresponding to two adjacent pre-amplifiers, the first comparing signals of the dynamic comparators corresponding to the two adjacent pre-amplifiers are complementary, and the two adjacent pre-amplifiers are coupled to two terminals of one resistor of the resistor chain, respectively. When each of the differential analog signals is not between the first reference voltages corresponding to the two adjacent pre-amplifiers, the first comparing signals of the dynamic comparators corresponding to the two adjacent pre-amplifiers are equal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
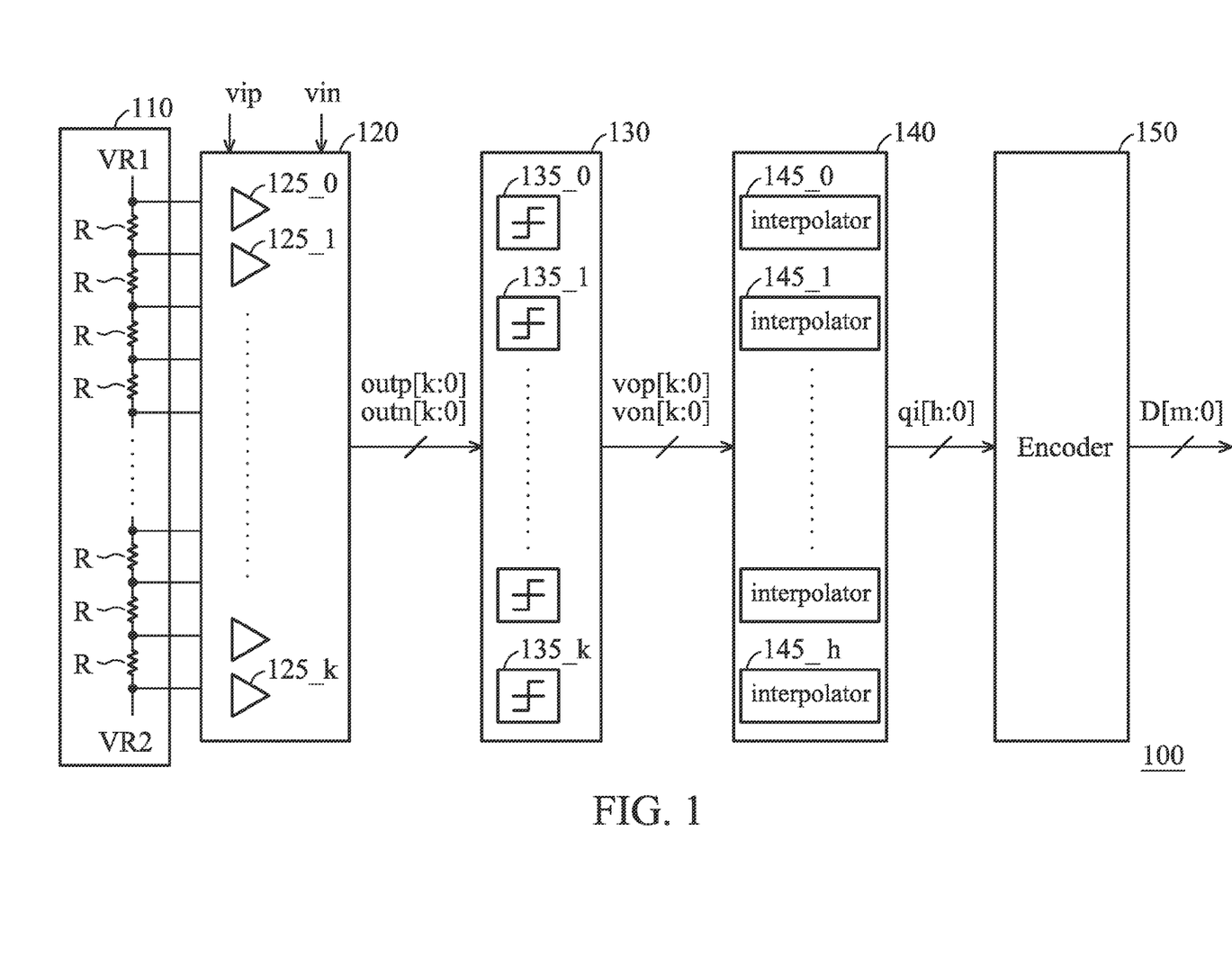
FIG. 1 shows an analog-to-digital converter (ADC) according to an embodiment of the invention.

FIG. 1 shows an analog-to-digital converter (ADC) 100 according to an embodiment of the invention. The ADC 100 comprises a resistor chain 110, an amplifier circuit 120, a comparator circuit 130, an interpolator circuit 140 and an encoder 150. In the embodiment, the ADC 100 is capable of converting a pair of differential analog signals vip/vin into an n-bit digital signal D. The resistor chain 110 is formed by a plurality of resistors R. The resistors R are coupled in series between the voltages VR1 and VR2, wherein the resistor chain 110 is capable of providing different divided voltages between the voltages VR1 and VR2 to the amplifier circuit 120. Furthermore, the amplifier circuit 120 amplifies the pair of differential analog signals vip/vin to provide a plurality of pairs of differential outputs outp[k:0]/outn[k:0] according to the divided voltages from the resistor chain 110, wherein the amplifier circuit 120 comprises a plurality of pre-amplifiers 125_0-125-$k$. The number of pre-amplifiers 125_0-125-$k$ is equal to $2^{(n-1)}+1$, wherein $k=2^{(n-1)}$. For example, the pre-amplifier 125_0 provides the pairs of differential outputs outp[0]/outn[0] according to the corresponding divided voltages and the pair of differential analog signals vip/vin. It should be noted the quantity of the pre-amplifiers 125_0-125-$k$ is less than that of a conventional ADC, e.g. $(2^{(n-1)}+1)<(2^n-1)$. Furthermore, the comparator circuit 130 comprises a plurality of dynamic comparators 135_0-135-$k$, wherein a quantity of the dynamic comparators 135_0-135-$k$ is also equal to $2^{(n-1)}+1$, wherein $k=2^{(n-1)}$. Each of the dynamic comparators 135_0-135-$k$ is coupled to the corresponding pre-amplifier, and compares the pairs of differential outputs of the corresponding pre-amplifier to provide a pair of comparing signals. For example, the dynamic comparator 135_0 is coupled to pre-amplifier 125_0, and the dynamic comparator 135_0 compares the pairs of differential outputs outp[0]/outn[0] of the pre-amplifier 125_0, to provide a pair of comparing signals vop[0]/von[0]. It should be noted that the quantity of the dynamic comparators 135_0-135-$k$ is smaller than that of a conventional ADC, e.g. $(2^{(n-1)}+1)<(2^n-1)$. Moreover, the interpolator circuit 140 comprises a plurality of interpolators 145_0-145_$h$, wherein a quantity of the interpolators 145_0-145_$h$ is equal to $2^{(n-1)}$, wherein $h=2^{(n-1)}-1$. Each of the interpolator 145_0-145_$h$ is coupled to the two corresponding dynamic comparators, and generates an interpolating signal according to the comparing signals of the two corresponding dynamic comparators. For example, the interpolator 145_0 provides an interpolating signal qi[0] according to the pairs of comparing signals vop[0]/von[0] of the dynamic comparator 135_0 and the pairs of comparing signals vop[1]/von[1] of the dynamic comparator 135_1. Next, the encode 150 provides a digital output D[m:0] according to the interpolating signals qi[h:0], wherein m=n–1.

Figure 2A:
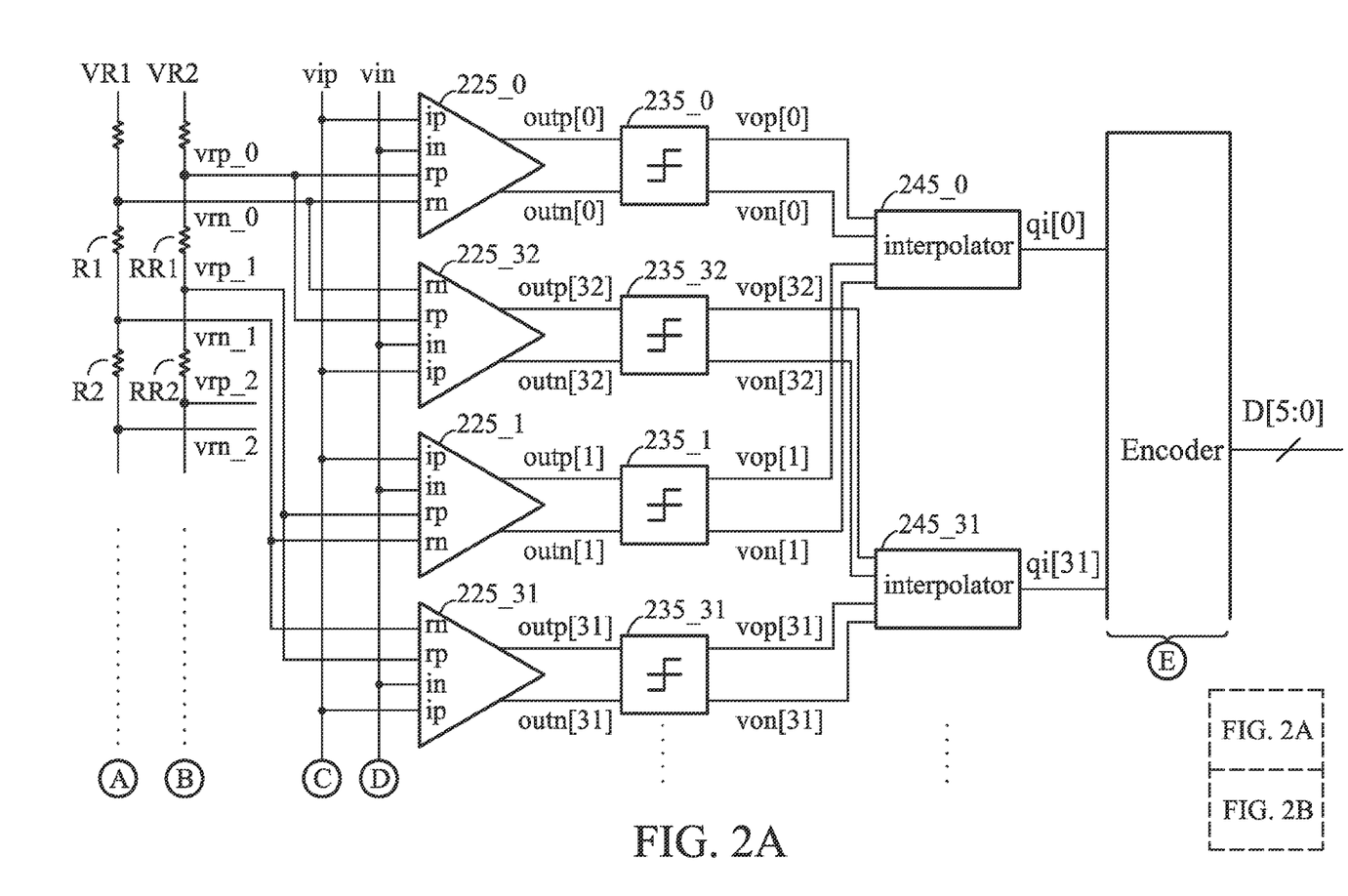
FIGS. 2A and 2B show a 6-bit ADC according to an embodiment of the invention.
Figure 2B:
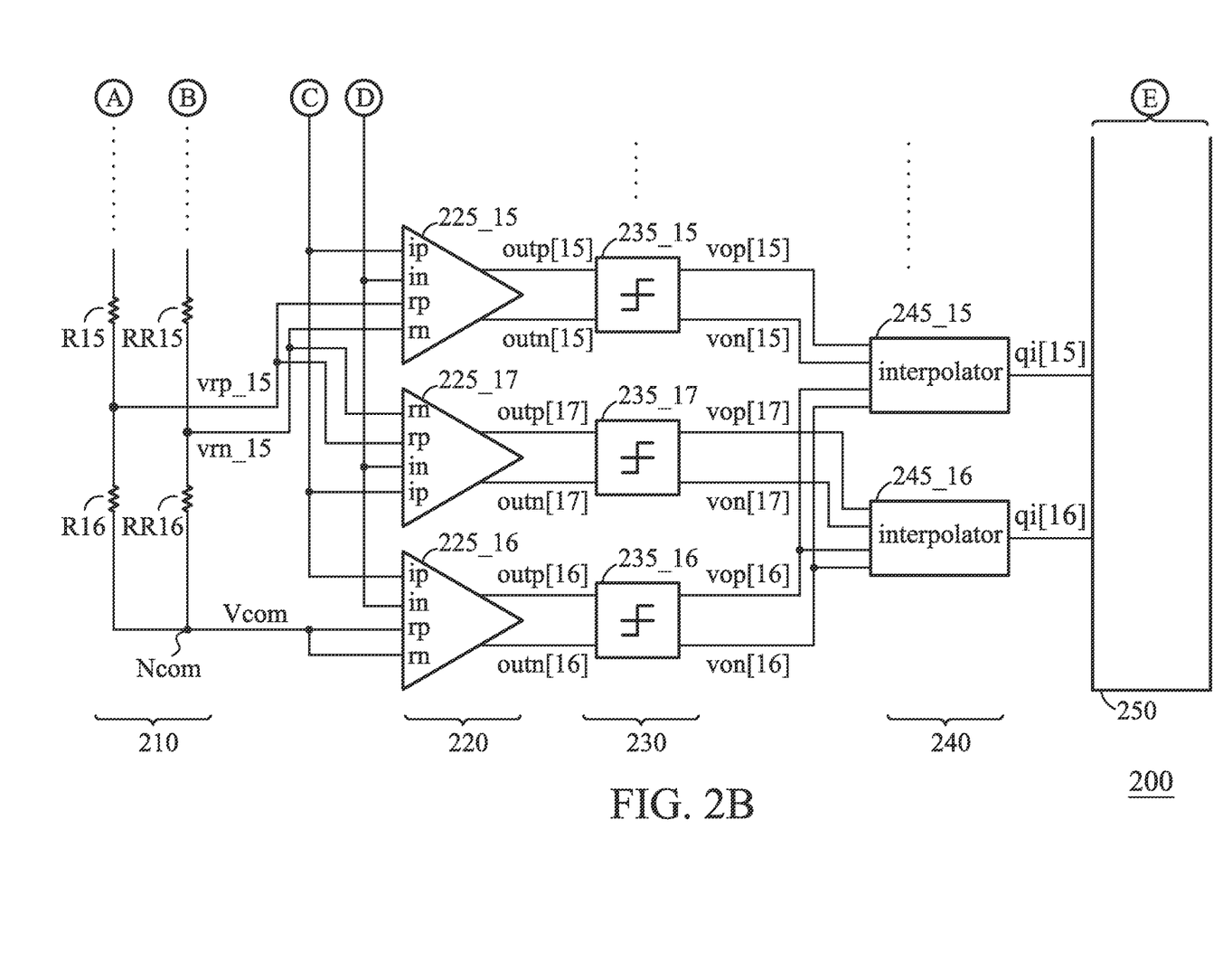

FIGS. 2A and 2B show a 6-bit ADC 200 according to an embodiment of the invention. The ADC 200 comprises a resistor chain 210, an amplifier circuit 220, a comparator circuit 230, an interpolator circuit 240 and an encoder 250. The resistor chain 210 comprises a plurality of resistors for providing the threshold reference voltages to the amplifier circuit 220, wherein the resistors are divided into two groups. A first group of resistors comprises the resistors R1-R16 connected in series between a voltage VR1 and a common node Ncom, and a second group of resistors comprises the resistors RR1-RR16 connected in series between a voltage VR2 and the common node Ncom. In the embodiment, the resistors of the resistor chain 210 have the same resistance. Moreover, a voltage Vcom at the common node Ncom is an average of the voltages VR1 and VR2. The amplifier circuit 220 comprises the pre-amplifiers 225_0-225_16. In the embodiment, each pre-amplifier 225_# receives a pair of differential analog signals vip/vin and a pair of reference voltages vrp_#/vrn_# from the resistor chain 210, to provide a pair of differential outputs outp[#]/outn[#]. For example, the pre-amplifier 225_0 receives the pair of differential analog signals vip/vin via the input terminals ip and in and receives the pair of reference voltages vrp_0/vrn_0 from the resistor chain 210 via the input terminals rp and rn, to provide the pair of differential outputs outp[0]/outn[0], wherein an average of the pair of reference voltages vrp_0 and vrn_0 is equal to the voltage Vcom. It should be noted that the voltages VR1 and VR2 corresponding to the pre-amplifier 225_0 are different from the voltages VR1 and VR2 corresponding to the pre-amplifier 225_32. Furthermore, the pre-amplifier 225_1 receives the pair of differential analog signals vip/vin via the input terminals ip and in and receives the pair of reference voltages vrp_1/vrn_1 from the resistor chain 210 via the input terminals rp and rn, to provide the pair of differential outputs outp[1]/outn[1], wherein an average of the pair of reference voltages vrp_1 and vrn_1 is equal to the voltage Vcom. It should be noted that the reference voltage vrn_0 corresponding to the pre-amplifier 225_0 and the reference voltage vrn_1 corresponding to the pre-amplifier 225_1 are respectively provided by two terminals of the resistor R1 of the resistor chain 210. Similarly, the reference voltage vrp_0 corresponding to the pre-amplifier 225_0 and the reference voltage vrp_1 corresponding to the pre-amplifier 225_1 are respectively provided by two terminals of the resistor RR1 of the resistor chain 210. Moreover, the comparator circuit 230 comprises a plurality of dynamic comparators 235_0-235_32, each coupled to the corresponding pre-amplifier. In the embodiment, each dynamic comparator 235_# compares the pair of differential outputs outp[#]/outn[#] from the corresponding pre-amplifier 225_# to provide a pair of comparing signals vop[#]/von[#]. For example, the dynamic comparator 235_0 is coupled to the pre-amplifier 225_0, and the dynamic comparator 235_0 compares the differential outputs outp[0]/outn[0] of the corresponding pre-amplifier 225_0, to obtain the pair of comparing signals vop[0]/von[0]. It should be noted that the pair of comparing signals vop[0] and von[0] are not differential. Moreover, the interpolator circuit 240 comprises a plurality of interpolators 245_0-245_31. In the embodiment, each interpolator 245_# provides an interpolating signal qi[#] according to the pair of comparing signals vop[#]/von[#] and the pair of comparing signals vop[#+1]/von[#+1]. For example, the interpolator 245_0 provides the interpolating signal qi[0] according to the pair of comparing signals vop[0]/von[0] of the dynamic comparator 235_0 and the pair of comparing signals vop[1]/von[1] of the dynamic comparator 235_1, the interpolator 245_1 provides the interpolating signal qi[1] according to the pair of comparing signals vop[1]/von[1] of the dynamic comparator 235_1 and the pair of comparing signals vop[2]/von[2] of the dynamic comparator 235_2, and so on. As described above, a quantity of the pre-amplifiers within the amplifier circuit 220 is equal to a quantity of the dynamic comparators within the comparator circuit 230, and a quantity of the interpolators within the interpolator circuit 240 is one less than that of the dynamic comparators within the comparator circuit 230. After obtaining the interpolating signals qi[0]-qi[31], the encoder 250 provides a digital output D[5:0]. Thus, a processor can obtain a digital value corresponding to the differential analog signals vip/vin. In other embodiments, for each pre-amplifier 225_#, its reference voltages vrp_# and vrn_# are not provided by the external devices, i.e. the reference voltages vrp_# and vrn_# are generated within the pre-amplifier 225_#. Specifically, each pre-amplifier can amplify the difference between the pair of differential analog signals vip/vin and the corresponding reference voltages to generate the corresponding differential outputs.

Figure 3:
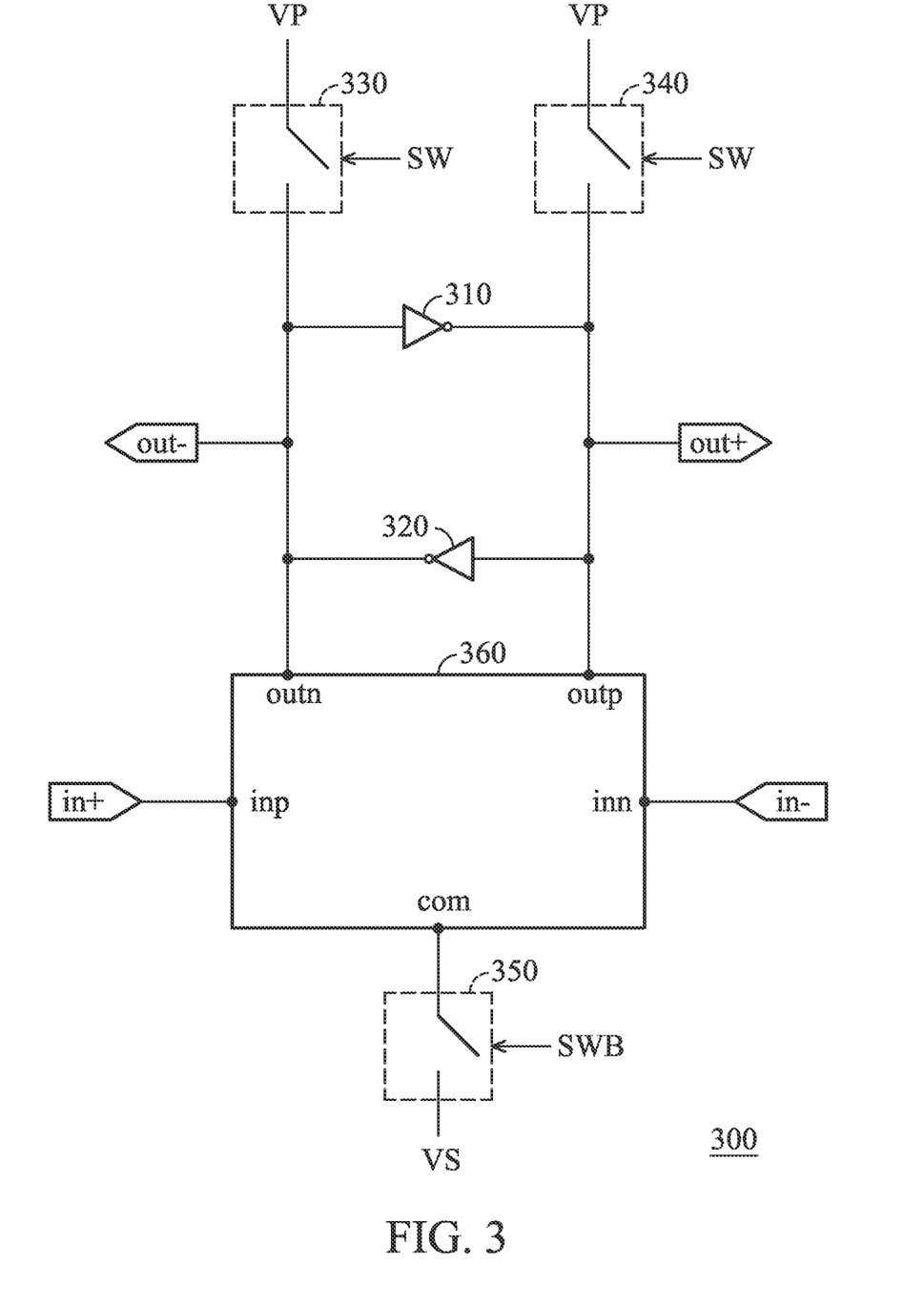
FIG. 3 shows a dynamic comparator according to an embodiment of the invention

FIG. 3 shows a dynamic comparator 300 according to an embodiment of the invention. The dynamic comparator 300 comprises two inverters 310 and 320, three switches 330, 340 and 350 and a transconductance (Gm) stage unit 360. An input terminal of the inverter 310 is coupled to an output terminal outn of the Gm stage unit 360 and an output terminal out– of the dynamic comparator 300, and an output terminal of the inverter 310 is coupled to an output terminal outp of the Gm stage unit 360 and an output terminal out+ of the dynamic comparator 300. An input terminal of the inverter 320 is coupled to the output terminal of the inverter 310, and an output terminal of the inverter 320 is coupled to the input terminal of the inverter 310. The switch 330 is coupled between a preset voltage VP and the output terminal outn of the Gm stage unit 360, wherein the switch 330 is controlled by a signal SW. The switch 340 is coupled between the preset voltage VP and the output terminal outp of the Gm stage unit 360, wherein the switch 340 is also controlled by the signal SW. Furthermore, the switch 350 is coupled between an evaluation voltage VS and a terminal com of the Gm stage unit 360, wherein the switch 350 is controlled by a signal SWB. It should be noted that the signals SW and SWB are opposite/complementary, and the preset voltage VP and the evaluation voltage VS are opposite/complementary. For example, if preset voltage VP is a power voltage (e.g. VDD), the evaluation voltage VS is a ground voltage (e.g. GND). Conversely, if preset voltage VP is the ground voltage, the evaluation voltage VS is the power voltage. Moreover, in a reset (or preset) phase Pr, the switches 330 and 340 are turned on by the signal SW and the switch 350 is turned off by the signal SWB, thus the voltages at the output terminals of the dynamic comparator 300 would be set to the preset voltage VP. Conversely, in an evaluation phase Pe, the switches 330 and 340 are turned off by the signal SW and the switch 350 is turned on by the signal SWB, thus the voltages at the output terminals out+ and out– of the dynamic comparator 300 are determined by the output signals at the output terminals outp and the outn of the Gm stage unit 360.

Figure 4:
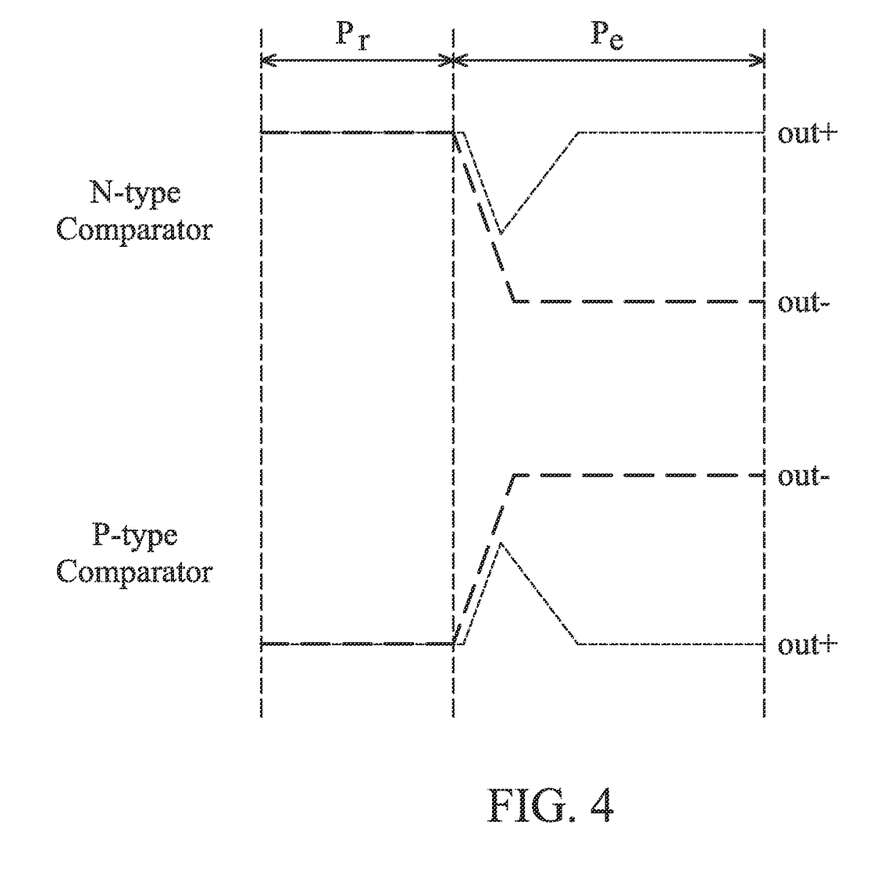
FIG. 4 shows a waveform diagram illustrating the voltages at the output terminals out+ and out− of the dynamic comparator of FIG. 3.

FIG. 4 shows a waveform diagram illustrating the voltages at the output terminals out+ and out– of the dynamic comparator 300 of FIG. 3. If the dynamic comparator 300 is an N-type comparator that the Gm stage unit 360 uses N-type transistors as input devices, the voltages at the output terminals out+ and out– of the dynamic comparator 300 are set to a high voltage level (high logic "H") in the reset phase Pr. Furthermore, in the evaluation phase Pe, the voltage at the output terminal out– of the dynamic comparator 300 is changed to a low voltage level (low logic "L") from the high voltage level, and the voltage at the output terminal out+ of the dynamic comparator 300 finally remains at the high voltage level. Conversely, if the dynamic comparator 300 is a P-type comparator that the Gm stage unit 360 uses P-type transistors as input devices, the voltages at the output terminals out+ and out– of the dynamic comparator 300 are set to the low voltage level in the reset phase Pr. Furthermore, in the evaluation phase Pe, the voltage at the output terminal out– of the dynamic comparator 300 is changed to the high voltage level from the low voltage level, and the voltage at the output terminal out+ of the dynamic comparator 300 finally remains at the low voltage level. Specifically, the voltages at the output terminals out+ and out– of the dynamic comparator 300 are complementary in the evaluation phase Pe, and the voltages at the output terminals out+ and out– of the dynamic comparator 300 are the same in the reset phase Pr.

Figure 5:
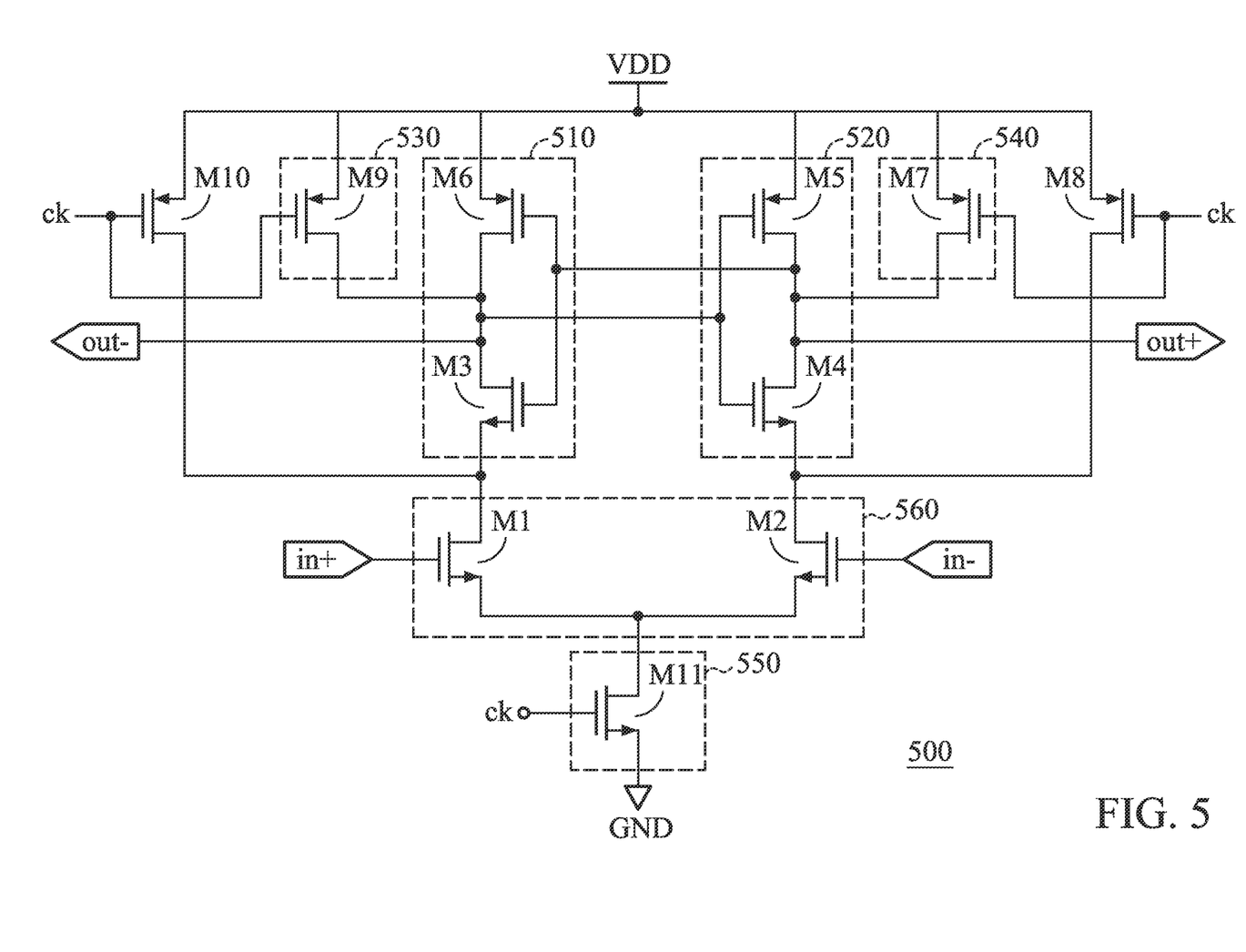
FIG. 5 shows a dynamic comparator according to another embodiment of the invention.

FIG. 5 shows a dynamic comparator 500 according to another embodiment of the invention. The dynamic comparator 500 comprises an inverter 510, an inverter 520, three switches 530, 540 and 550, a Gm stage unit 560 and two PMOS transistors M8 and M10. The inverter 510 is formed by a PMOS transistor M6 and an NMOS transistor M3, and the inverter 520 is formed by a PMOS transistor M5 and an NMOS transistor M4. The switch 530 comprises a PMOS transistor M9 coupled between the power VDD and the NMOS transistor M3, wherein a gate of the PMOS transistor M9 is controlled by a signal ck. In the embodiment, the signal ck is a periodic pulse signal for switching a reset phase Pr and an evaluation phase Pe. Furthermore, the switch 540 comprises a PMOS transistor M7 coupled between the power VDD and the NMOS transistor M4, wherein a gate of the PMOS transistor M7 is also controlled by the signal ck. Moreover, the switch 550 comprises an NMOS transistor M11 coupled between a ground GND and the Gm stage unit 560, wherein a gate of the NMOS transistor M11 is also controlled by the signal ck. The Gm stage unit 560 comprises an NMOS transistor M1 coupled between the NMOS transistors M11 and M3, and an NMOS transistor M2 coupled between the NMOS transistors M11 and M4. Specifically, the NMOS transistors M1 and M2 are a differential pair of input transistors, thus the dynamic comparator 500 is an N-type comparator. Furthermore, the PMOS transistor M10 is coupled between the power VDD and the NMOS transistor M1, and a gate of the PMOS transistor M10 is controlled by the signal ck. The PMOS transistor M8 is coupled between the power VDD and the NMOS transistor M2, and a gate of the PMOS transistor M10 is controlled by the signal ck. Similarly, in the reset phase Pr, the PMOS transistors M9 and M7 are turned on by the signal ck and the NMOS transistor M11 is turned off by the signal ck. Thus, the output terminals out+ and out– dynamic comparator 500 are coupled to the power VDD, and the voltages at the output terminals out+ and out– of the dynamic comparator 500 are equal to the power VDD. Conversely, in the evaluation phase Pe, the PMOS transistors M9 and M7 are turned off by the signal ck, and the NMOS transistor M11 is turned on by the signal ck. Thus, the dynamic comparator 500 can compare the signals at the input terminals in+ and in– thereof to provide the output signals at the output terminals out+ and out– thereof.

Figure 6:
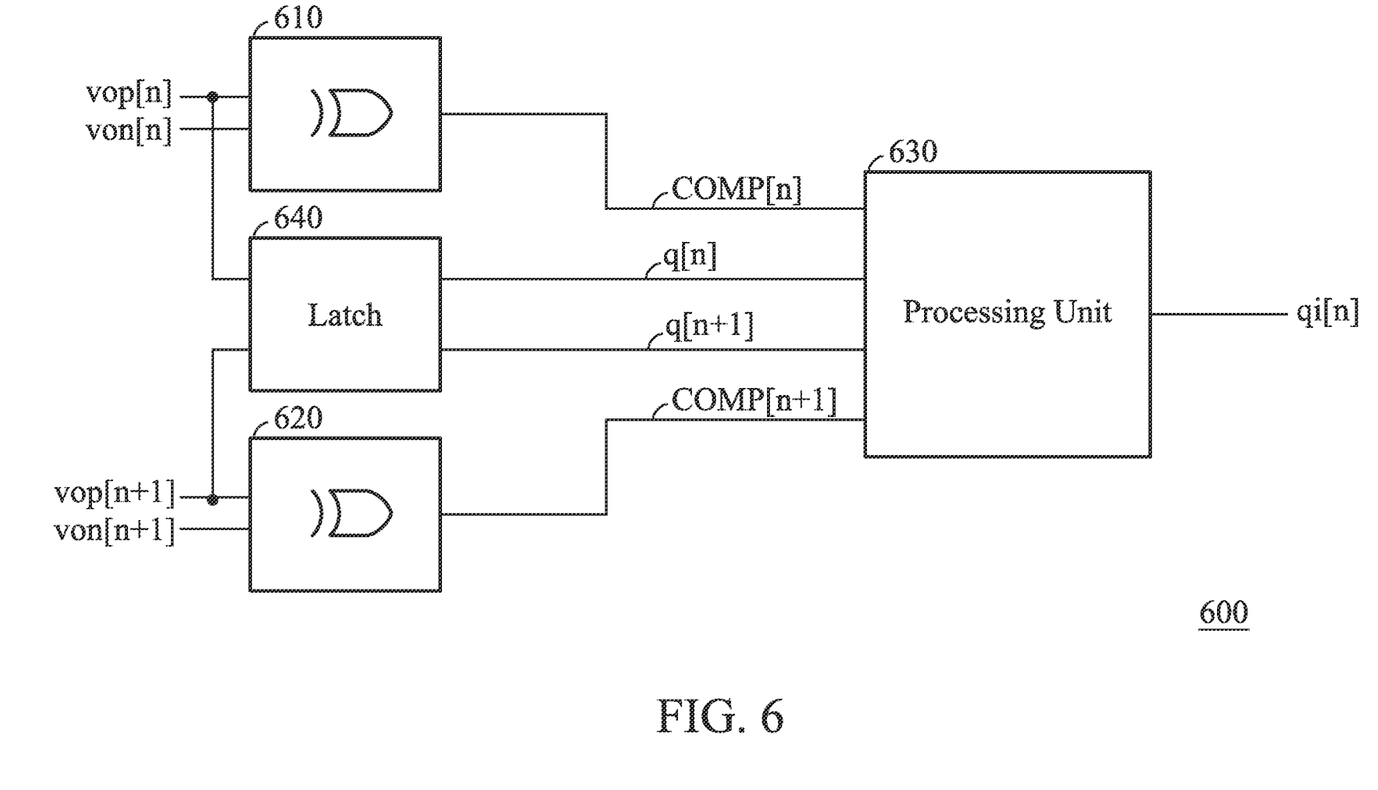
FIG. 6 shows an interpolator according to an embodiment of the invention.

FIG. 6 shows an interpolator 600 according to an embodiment of the invention. The interpolator 600 comprises the processing units 610, 620 and 630, and a latch 640. The processing unit 610 receives a pair of comparing signals vop[n]/von[n] from the corresponding dynamic comparator $CMP_n$, and provides a signal COMP[n] to indicate whether a comparison of the dynamic comparator $CMP_n$ is completed. Similarly, the processing unit 620 receives a pair of comparing signals vop[n+1]/von[n+1] from the corresponding dynamic comparator $CMP_{n+1}$, and provides a signal COMP[n+1] to indicate whether a comparison of the dynamic comparator $CMP_{(n+1)}$ is completed. Furthermore, the latch 640 will latch the comparing signal vop[n] from the dynamic comparator $CMP_n$ and the comparing signal vop[n+1] from the dynamic comparator $CMP_{n+1}$ to provide the latched signals q[n] and q[n+1], respectively. In another embodiment, the latch 640 will latch the comparing signal von[n] from the dynamic comparator $CMP_n$ and the comparing signal von[n+1] from the dynamic comparator $CMP_{n+1}$ to provide the latched signals q[n] and q[n+1], respectively. In the embodiment, each of the processing units 610 and 620 is an XOR gate. In general, the output of an XOR gate is true (i.e. a high logic "H") only when exactly one of its inputs is true. As described above, the pair of comparing signals of each dynamic comparator are complementary in the evaluation phase Pe. Therefore, once the comparing signals vop[n]/von[n] become the complementary levels from the same logic level, the processing unit 610 will provide the signal COMP[n] with a high logic "H" until the dynamic comparator $CMP_n$ enters the reset phase Pr.

Similarly, once the comparing signals vop[n+1]/von[n+1] become the complementary levels from the same logic level, the processing unit 620 will provide the signal COMP[n+1] with a high logic "H" until the dynamic comparator CMP$_n$ enters the reset phase Pr. Next, according to the signals COMP[n], COMP[n+1], q[n] and q[n+1], the processing unit 630 provides an interpolating signal qi[n], to indicate which comparison of the dynamic comparators CMP$_n$ and CMP$_{n+1}$ is earlier than another comparison. Furthermore, due to a pair of comparing signals provided by the corresponding dynamic comparator being set to a fixed preset values (e.g. "H" or "L"), the XOR gate can be further simplified to be a NAND gate (preset to "H") or an OR gate (preset to "L").

Figure 7:
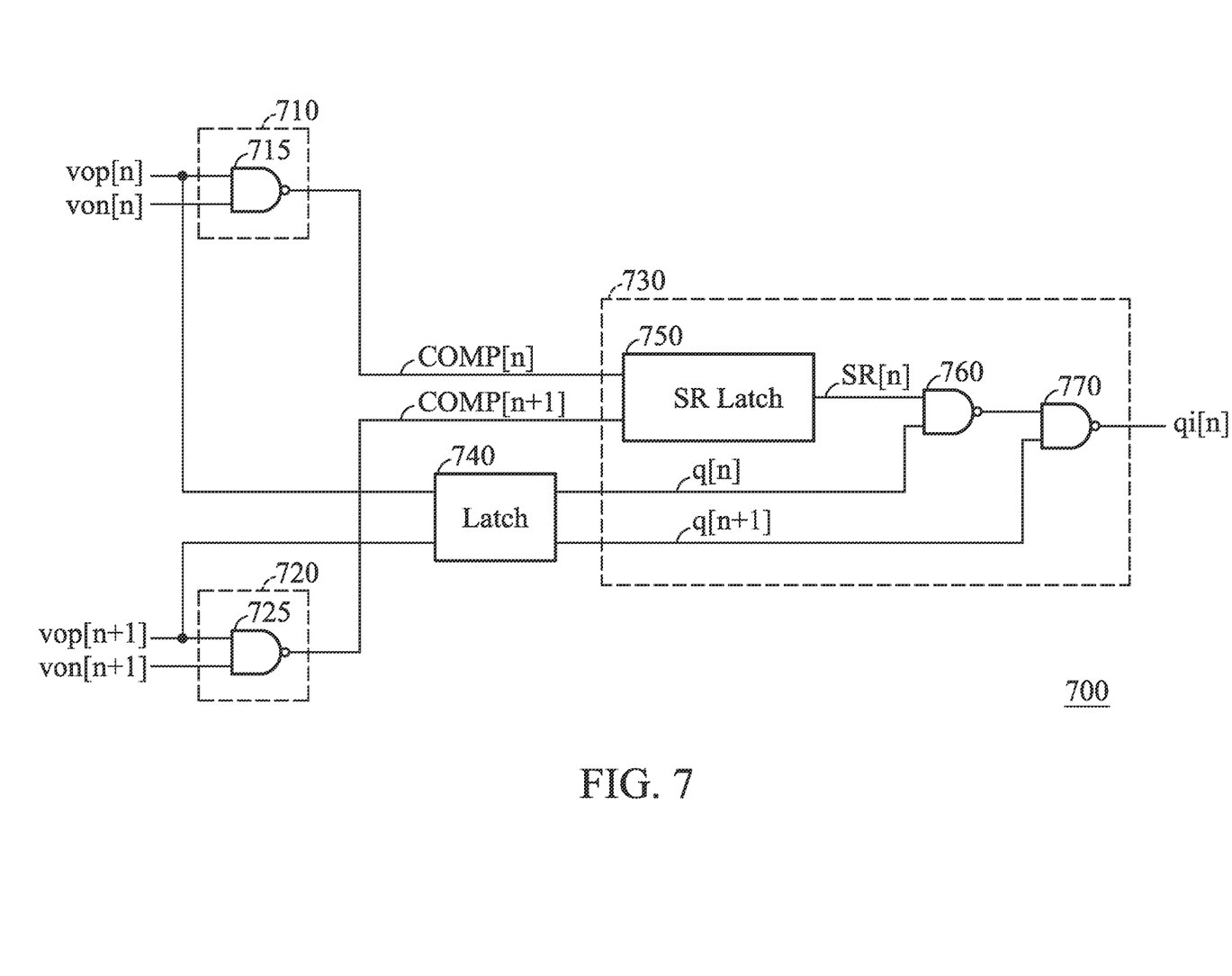
FIG. 7 shows an interpolator according to another embodiment of the invention.
Figure 8:
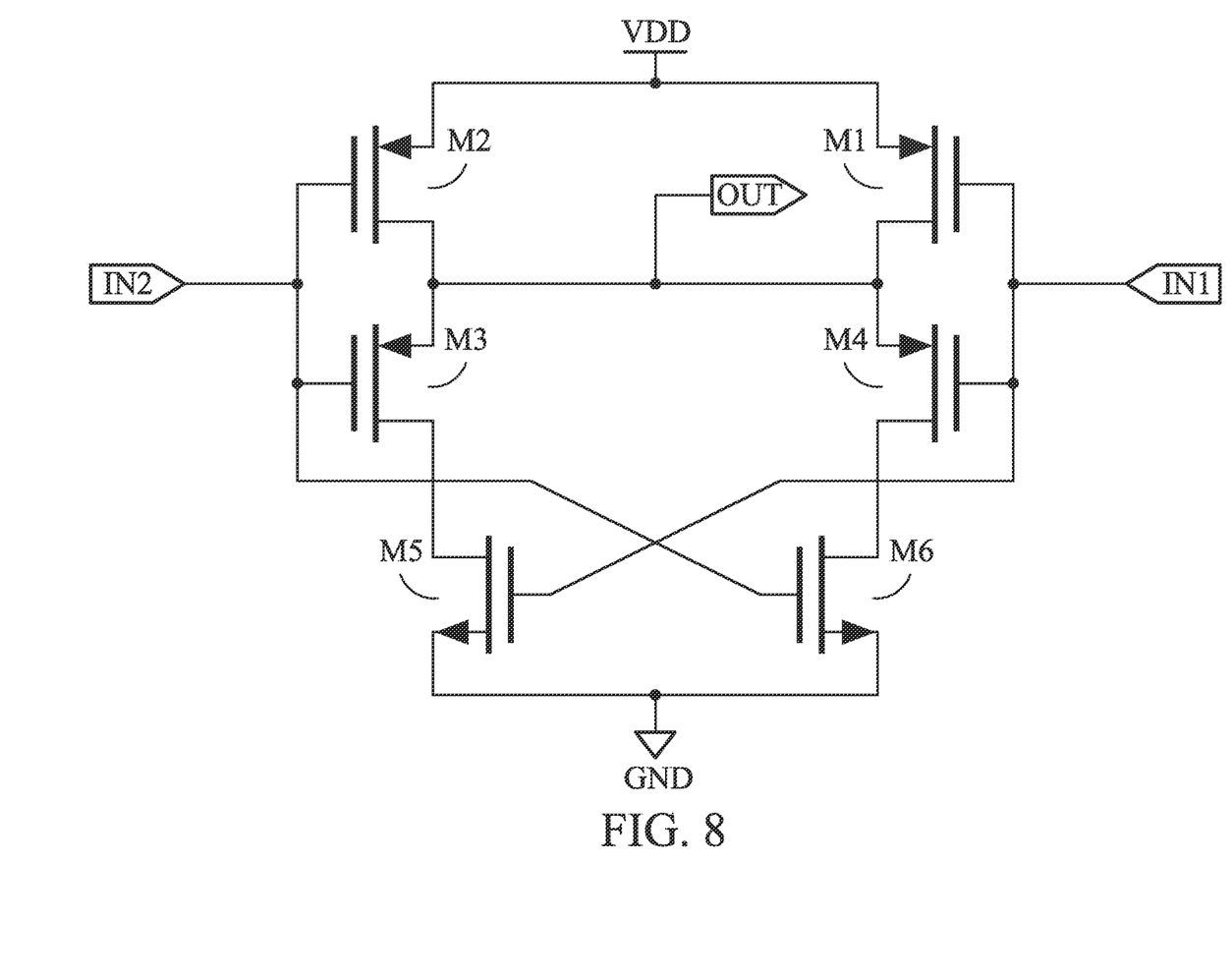
FIG. 8 shows a schematic illustrating a symmetric NAND gate.
Figure 9:
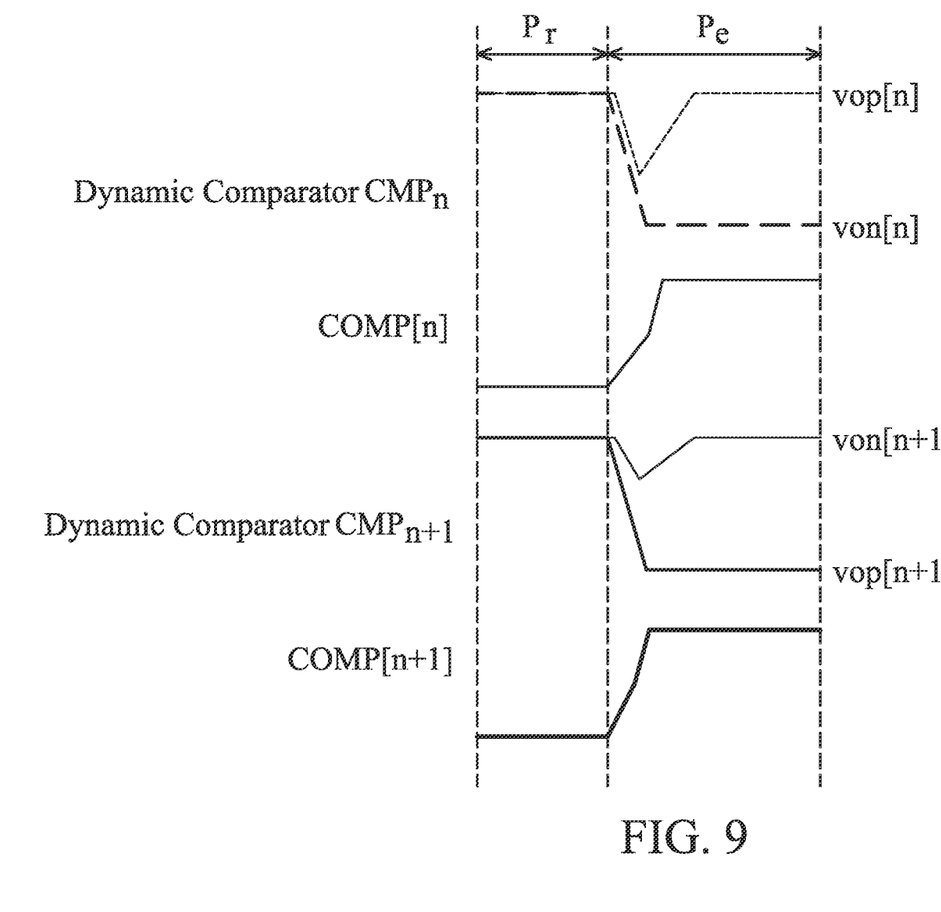
FIG. 9 shows a waveform diagram illustrating the signals of the NAND gates of FIG. 7.

FIG. 7 shows an interpolator 700 according to another embodiment of the invention. The interpolator 700 comprises the processing units 710, 720 and 730, and a latch 740. In the embodiment, because of the comparing signals vop[n], von[n], vop[n+1] and von[n+1] are set to a high logic level "H", the processing units 710 and 720 comprise the symmetric NAND gates 715 and 725, respectively. Referring to FIG. 8, FIG. 8 shows a schematic illustrating a symmetric NAND gate. As shown in FIG. 8, the transistors M2, M3 and M5 are symmetrical to the transistors M1, M4 and M6 in the size and layout, respectively. In FIG. 7, the NAND gate 715 provides the signal COMP[n] according to the pair of comparing signals vop[n]/von[n] from the dynamic comparator CMP$_n$, and the NAND gate 725 provides the signal COMP[n+1] according to the pair of comparing signals vop[n+1]/von[n+1] from the dynamic comparator CMP$_n$. As shown in FIG. 9, FIG. 9 shows a waveform diagram illustrating the signals of the NAND gates 715 and 725 of FIG. 7. In the embodiment, a transition of the signal COMP[n] is slower than that of the signal COMP[n+1] in the evaluation phase Pe due to the analog signals vip being between the reference voltages vrp_n and vrp_n+1 and close to the reference voltage vrp_n. Conversely, if the analog signal vip is between the reference voltages vrp_n and vrp_n+1 and close to the reference voltage vrp_n+1, the transition of the signal COMP[n+1] is slower than that of the signal COMP[n] in the evaluation phase Pe. Furthermore, if the analog signals vip is between the reference voltages vrp_n and vrp_n+1, the comparing signal vop[n] of the dynamic comparator CMP$_n$ and the comparing signal vop[n+1] of the dynamic comparator CMP$_{n+1}$ are complementary. Conversely, if the analog signal vip is not between the reference voltages vrp_n and vrp_n+1, the comparing signal vop[n] of the dynamic comparator CMP$_n$ and the comparing signal vop[n+1] of the dynamic comparator CMP$_{n+1}$ are the same.

Figure 10A:
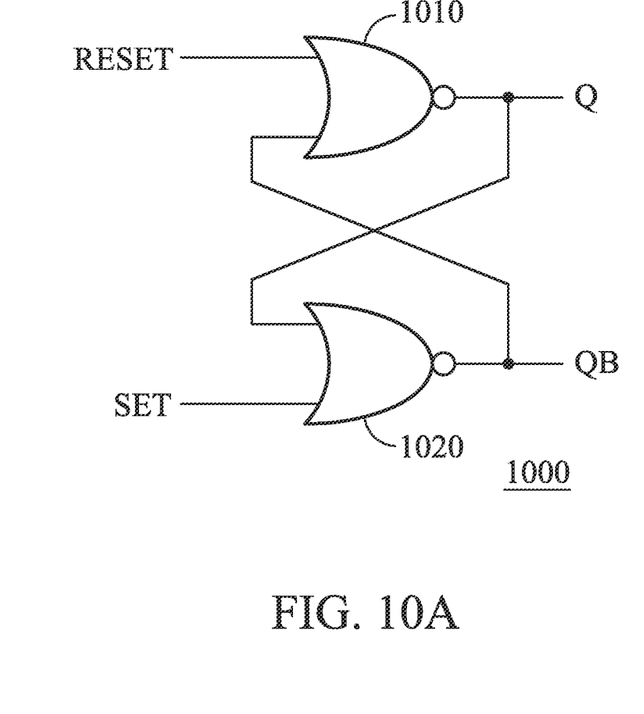
FIG. 10A shows a schematic illustrating an SR latch.
Figure 10B:
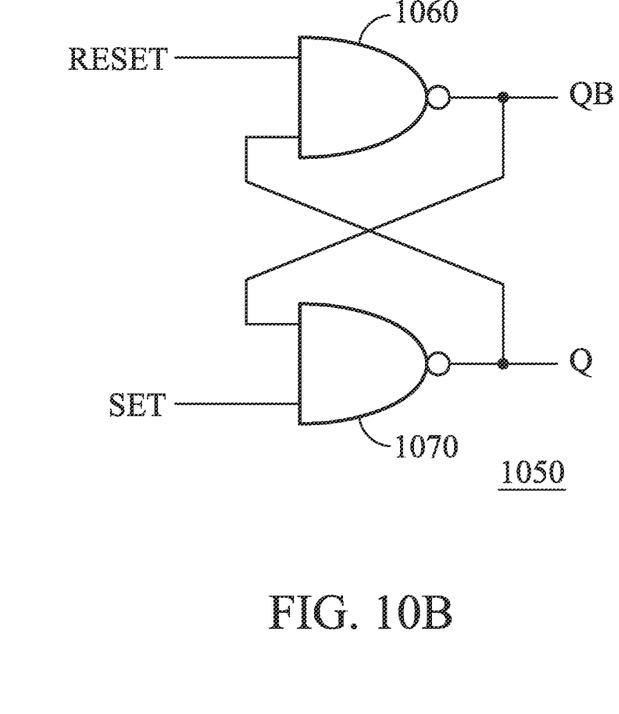
FIG. 10B shows a schematic illustrating an SR latch.

In FIG. 7, the latch 740 will latch the comparing signal vop[n] and the comparing signal vop[n+1] to provide the latched signals q[n] and q[n+1], respectively. Furthermore, the processing unit 730 comprises a set-reset (SR) latch 750 and two NAND gates 760 and 770. The SR latch 750 provides a signal SR[n] according to the signals COMP[n] and COMP[n+1], to indicate which of the outputs of the NAND gates 715 and 725 is earlier than the others in transition. Next, according to the signals SR[n], q[n] and q[n+1], the NAND gates 760 and 770 provides an interpolating signal qi[n] to indicate which of the dynamic comparators (CMP$_n$ or CMP$_{n+1}$) is earlier to complete its comparison. Thus, the subsequent processes can be performed according to all of the interpolating signals. Furthermore, the interpolating signal qi[n] can be verified according to the following equation: qi[n]=SR[n]*q[n]+q[n+1]. It should be noted that a type of the SR latch is determined according to the fixed preset values of the comparing signals of the dynamic comparators in the evaluation phase Pe. For example, if the comparing signals of the dynamic comparators are set to a low logic "L", an SR latch 1000 constructed from a pair of cross-coupled NOR gates 1010 and 1020 is used, as shown in FIG. 10A. Conversely, if the comparing signals of the dynamic comparators are set to a high logic "H", an SR latch 1050 constructed from a pair of cross-coupled NAND gates 1060 and 1070 is used, as shown in FIG. 10B.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog-to-digital converter, comprising:
    a plurality of pre-amplifiers, each receiving a pair of differential analog signals, a first reference voltage corresponding to one of the differential analog signals and a second reference voltage corresponding to another of the differential analog signals, and amplifying difference between the pair of differential analog signals and the first and second reference voltages to provide a pair of differential outputs, wherein the first reference voltage is different from the second reference voltage;
    a plurality of dynamic comparators coupled to the pre-amplifiers, each providing a first comparing signal and a second comparing signal according to the pair of differential outputs of the corresponding pre-amplifier;
    a plurality of interpolators, each providing an interpolating signal according to the first and second comparing signals of two of the dynamic comparators; and
    an encoder, providing a digital output according to the interpolating signals,
    wherein the first and second comparing signals are the same in a reset phase, and the first and second comparing signals are complementary according to the pair of differential outputs of the corresponding pre-amplifier in an evaluation phase,
    wherein the dynamic comparator comprises:
    a transconductance (Gm) stage unit, having a first input terminal for receiving one output among the pair of differential outputs of the corresponding pre-amplifier, a second input terminal for receiving another output among the pair of differential outputs of the corresponding pre-amplifier, a first output terminal for providing the first comparing signal, a second output terminal for providing the second comparing signal, and a command terminal;
    a first inverter, having an input terminal coupled to the first output terminal of the Gm stage unit, and an output terminal coupled to the second output terminal of the Gm stage unit;
    a second inverter, having an input terminal coupled to the second output terminal of the Gm stage unit, and an output terminal coupled to the first output terminal of the Gm stage unit;
    a first switch coupled between a first voltage source and the first output terminal of the Gm stage unit;

a second switch coupled between the first voltage source and the second output terminal of the Gm stage unit; and a third switch coupled between a second voltage source and the command terminal of the Gm stage unit.

2. The analog-to-digital converter as claimed in claim 1, wherein the digital output is a N-bit signal, and a quantity of the pre-amplifiers and a quantity of the dynamic comparators are is equal to $2^{(N-1)}+1$, wherein a quantity of the interpolators is equal to $2^{(N-1)}$.

3. The analog-to-digital converter as claimed in claim 1, wherein the first and second switches are turned on and the third switch is turned off in the reset phase, and the first and second switches are turned off and the third switch is turned on in the evaluation phase.

4. The analog-to-digital converter as claimed in claim 1, wherein an average value of the first and second reference voltages corresponding to each of the pre-amplifiers is the same.

5. An analog-to-digital converter, comprising:
a plurality of pre-amplifiers, each receiving a pair of differential analog signals, a first reference voltage corresponding to one of the differential analog signals and a second reference voltage corresponding to another of the differential analog signals, and amplifying difference between the pair of differential analog signals and the first and second reference voltages to provide a pair of differential outputs, wherein the first reference voltage is different from the second reference voltage;
a plurality of dynamic comparators coupled to the pre-amplifiers, each providing a first comparing signal and a second comparing signal according to the pair of differential outputs of the corresponding pre-amplifier;
a plurality of interpolators, each providing an interpolating signal according to the first and second comparing signals of two of the dynamic comparators; and
an encoder, providing a digital output according to the interpolating signals,
wherein the first and second comparing signals are the same in a reset phase, and the first and second comparing signals are complementary according to the pair of differential outputs of the corresponding pre-amplifier in an evaluation phase,
wherein the interpolator comprises:
a first processing unit coupled to a first dynamic comparator among the dynamic comparators, determining whether a first comparison of the first dynamic comparator is completed according to the first and second comparing signals of the first dynamic comparator;
a second processing unit coupled to a second dynamic comparator among the dynamic comparators, determining whether a second comparison of the second dynamic comparator is completed according to the first and second comparing signals of the second dynamic comparator;
a third processing unit coupled to the first and second processing units, determining which comparison of the first and second comparisons is earlier than the other comparison, to provide the interpolating signal.

6. The analog-to-digital converter as claimed in claim 5, wherein a first pre-amplifier and a second pre-amplifier among the pre-amplifiers are respectively coupled to the first and second dynamic comparators, and the first reference voltages corresponding to the first and second pre-amplifiers are different, and the second reference voltages corresponding to the first and second pre-amplifiers are different.

7. The analog-to-digital converter as claimed in claim 6, wherein when one of the differential analog signals is between the first reference voltage corresponding to the first pre-amplifier and the first reference voltage corresponding to the second pre-amplifier, the first comparing signal of the first dynamic comparator is complementary to the first comparing signal of the second dynamic comparator.

8. The analog-to-digital converter as claimed in claim 6, wherein when each of the differential analog signals is not between the first reference voltage corresponding to the first pre-amplifier and the first reference voltage corresponding to the second pre-amplifier, the first comparing signal of the first dynamic comparator is equal to the first comparing signal of the second dynamic comparator.

9. The analog-to-digital converter as claimed in claim 6, wherein when one of the differential analog signals is between the first reference voltage corresponding to the first pre-amplifier and the first reference voltage corresponding to the second pre-amplifier and close to the first reference voltage corresponding to the first pre-amplifier, the third processing unit determines that the completion of the second comparison is earlier than the completion of the first comparison, and when the one of the differential analog signals is between the first reference voltage corresponding to the first pre-amplifier and the first reference voltage corresponding to the second pre-amplifier and close to the first reference voltage corresponding to the second pre-amplifier, the third processing unit determines that the completion of the first comparison is earlier than the completion of the second comparison.

10. The analog-to-digital converter as claimed in claim 5, wherein the first and second processing units comprises XOR gates, and the third processing unit comprises an SR latch.

11. The analog-to-digital converter as claimed in claim 5, wherein when the first and second comparing signals are a high logic level in the reset phase for the dynamic comparators, each of the first and second processing units comprises a NAND gate, and the third processing unit comprises an SR latch formed by two NAND gates, wherein when the first and second comparing signals are a low logic level in the reset phase for the dynamic comparators, each of the first and second processing units comprises an OR gate, and the third processing unit comprises an SR latch formed by two NOR gates.

12. An analog-to-digital converter, comprising:
a plurality of pre-amplifiers, each providing a pair of differential outputs according to a pair of differential analog signals and a first reference voltage and a second reference voltage, wherein the first reference voltage corresponding to one of the differential analog signals is different from the second reference voltage corresponding to another of the differential analog signals;
a plurality of dynamic comparators coupled to the pre-amplifiers, each providing a first comparing signal and a second comparing signal according to the pair of differential outputs of the corresponding pre-amplifier;
a plurality of interpolators, each providing an interpolating signal according to the first and second comparing signals of two of the dynamic comparators; and
an encoder, providing a digital output according to the interpolating signals,
wherein when one of the differential analog signals is between the first reference voltages corresponding to two adjacent pre-amplifiers, the first comparing signals of the dynamic comparators corresponding to the two adjacent pre-amplifiers are complementary, wherein when each of the differential analog signals is not between the first reference voltages corresponding to the two adjacent pre-amplifiers, the first comparing signals of the dynamic comparators corresponding to the two adjacent pre-amplifiers are equal.

13. The analog-to-digital converter as claimed in claim 12, wherein the digital output is a N-bit signal, and a quantity of the pre-amplifiers and a quantity of the dynamic comparators are is equal to $2^{(N-1)}+1$, wherein a quantity of the interpolators is equal to $2^{(N-1)}$.

14. The analog-to-digital converter as claimed in claim 12, wherein the dynamic comparator comprises:
a transconductance (Gm) stage unit, having a first input terminal for receiving one output among the pair of differential outputs of the corresponding pre-amplifier, a second input terminal for receiving another output among the pair of differential outputs of the corresponding pre-amplifier, a first output terminal for providing the first comparing signal, a second output terminal for providing the second comparing signal, and a command terminal;
a first inverter, having an input terminal coupled to the first output terminal of the Gm stage unit, and an output terminal coupled to the second output terminal of the Gm stage unit;
a second inverter, having an input terminal coupled to the second output terminal of the Gm stage unit, and an output terminal coupled to the first output terminal of the Gm stage unit;
a first switch coupled between a first voltage source and the first output terminal of the Gm stage unit;
a second switch coupled between the first voltage source and the second output terminal of the Gm stage unit; and
a third switch coupled between a second voltage source and the command terminal of the Gm stage unit.

15. The analog-to-digital converter as claimed in claim 14, wherein the first and second switches are turned on and the third switch is turned off in the reset phase, and the first and second switches are turned off and the third switch is turned on in the evaluation phase.

16. The analog-to-digital converter as claimed in claim 12, wherein an average value of the first and second reference voltages corresponding to each of the pre-amplifiers is the same.

17. The analog-to-digital converter as claimed in claim 12, wherein the interpolator comprises:

a first processing unit coupled to a first dynamic comparator among the dynamic comparator, determining whether a first comparison of the first dynamic comparator is completed according to the first and second comparing signals of the first dynamic comparator;
a second processing unit coupled to a second dynamic comparator among the dynamic comparators, determining whether a second comparison of the second dynamic comparator is completed according to the first and second comparing signals of the second dynamic comparator;
a third processing unit coupled to the first and second processing units, determining which one of a completion of the first or second comparisons is earlier, to provide the interpolating signal.

18. The analog-to-digital converter as claimed in claim 17, wherein a first pre-amplifier and a second pre-amplifier among the pre-amplifiers are respectively coupled to the first and second dynamic comparators, wherein when one of the differential analog signals is between the first reference voltage corresponding to the first and second pre-amplifiers and close to the first reference voltage corresponding to the first pre-amplifier, the third processing unit determines that the completion of the second comparison is earlier than the completion of the first comparison.

19. The analog-to-digital converter as claimed in claim 18, wherein when the one of the differential analog signals is between the first reference voltages corresponding to the first and second pre-amplifiers and close to the first reference voltage corresponding to the second pre-amplifier, the third processing unit determines that the completion of the first comparison is earlier than the completion of the second comparison.

20. The analog-to-digital converter as claimed in claim 17, wherein the first and second processing units comprises XOR gates, and the third processing unit comprises an SR latch.

21. The analog-to-digital converter as claimed in claim 17, wherein when the first and second comparing signals are a high logic level in the reset phase for the dynamic comparators, each of the first and second processing units comprises a NAND gate, and the third processing unit comprises an SR latch formed by two NAND gates, wherein when the first and second comparing signals are a low logic level in the reset phase for the dynamic comparators, each of the first and second processing units comprises a OR gate, and the third processing unit comprises an SR latch formed by two NOR gates.

* * * * *